(12) United States Patent
Xu et al.

(10) Patent No.: US 8,377,769 B2
(45) Date of Patent: Feb. 19, 2013

(54) METHOD FOR INTEGRATING REPLACEMENT GATE IN SEMICONDUCTOR DEVICE

(75) Inventors: Gaobo Xu, Beijing (CN); Qiuxia Xu, Beijing (CN)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 0 days.

(21) Appl. No.: 13/379,169

(22) PCT Filed: Aug. 2, 2011

(86) PCT No.: PCT/CN2011/077905
§ 371 (c)(1),
(2), (4) Date: Dec. 19, 2011

(87) PCT Pub. No.: WO2013/000190
PCT Pub. Date: Jan. 3, 2013

(65) Prior Publication Data
US 2013/0005097 A1    Jan. 3, 2013

(30) Foreign Application Priority Data
Jun. 30, 2011    (CN) .......................... 2011 1 0181587

(51) Int. Cl.
*H01L 21/8238*    (2006.01)
(52) U.S. Cl. .. 438/199; 438/303; 438/697; 257/E21.632
(58) Field of Classification Search ................. 438/199, 438/223, 224, 230, 231, 301, 303, 697, 723, 438/724; 257/E21.632
See application file for complete search history.

(56) References Cited

U.S. PATENT DOCUMENTS
2012/0003806 A1* 1/2012 Wang ........................... 438/305
* cited by examiner

*Primary Examiner* — Thanhha Pham
(74) *Attorney, Agent, or Firm* — Westman, Champlin & Kelly, P.A.

(57) ABSTRACT

A method for integrating a replacement gate in a semiconductor device is disclosed. The method may comprise: forming a well region on a semiconductor substrate, and defining a N-type device region and/or a P-type device region; forming a sacrificial gate stack or sacrificial gate stacks respectively on the N-type device region and/or the P-type device region, the sacrificial gate stack or each of the sacrificial gate stacks comprising a sacrificial gate dielectric layer and a sacrificial gate electrode layer, wherein the sacrificial gate dielectric layer is disposed on the semiconductor substrate, and the sacrificial gate electrode layer is disposed on the sacrificial gate dielectric layer; forming a spacer or spacers surrounding the sacrificial gate stack or the respective sacrificial gate stacks; forming source/drain regions on both sides of the sacrificial gate stack or the respective sacrificial gate stacks and embedded into the semiconductor substrate; forming a $SiO_2$ layer on the semiconductor substrate; forming a SOG layer on the $SiO_2$ layer; etching the SOG layer until the $SiO_2$ layer is exposed; etching the SOG layer and the $SiO_2$ layer at different rates in such a manner that the $SiO_2$ layer is planarized; and forming a N-type replacement gate stack on the N-type device region and/or a P-type replacement gate stack on the P-type device region, respectively.

23 Claims, 7 Drawing Sheets

METHOD FOR INTEGRATING REPLACEMENT GATE IN SEMICONDUCTOR DEVICE

CROSS-REFERENCE TO RELATED APPLICATION(S)

This application is a national phase application of, and claims priority to PCT Application No. PCT/CN2011/077905, filed on Aug. 2, 2011, entitled "Method for Integrating Replacement Gate in Semiconductor Device," which claimed priority to Chinese Application No. 201110181587.7 filed on Jun. 30, 2011, both the PCT Application and the Chinese Application are incorporated herein by reference in their entireties.

TECHNICAL FIELD

The present disclosure relates to the filed of ultra deep submicron semiconductor devices, and more specifically, to a method for integrating a replacement gate in a semiconductor device having a high-K gate dielectric/metal gate arrangement. In this method, a stack of sacrificial $SiO_2$/poly-silicon gate can be used as a sacrificial gate stack. After a planarization process, respective sacrificial gate stacks on a N-type device region and a P-type device region can be removed, and replacement gate stacks of high-K gate dielectric/metal gate are formed instead. Accordingly, it is possible to achieve integration of the N-type and P-type devices having the high-K gate dielectric/metal gate arrangement.

BACKGROUND

The Integrated Circuit (IC) technology has developed following the Moore law for more than 40 years. Specifically, ICs have their feature sizes continuously scaled down, integration densities continuously improved, and functions increasingly enhanced. Currently, Metal Oxide Semiconductor Field Effect Transistors (MOSFETs) already have their feature sizes scaled into the range of sub-50 nanometers. With the continuous scaling of the feature sizes, if a conventional gate of poly-silicon is adopted, then the poly-silicon will encounter more and more serious depletion effects and thus have its resistance increased. Further, PMOS devices will exhibit more significant Boron punch-through phenomenon. All those obstacles significantly prevent the device performances from being further improved. To overcome the above difficulties, the industry starts to replace the conventional gate arrangement of silicon oxide/poly-silicon with a gate arrangement of high dielectric constant (high-K) gate dielectric/metal gate.

In the manufacture of semiconductor devices having the high-K gate dielectric/metal gate arrangement, conventionally there are two types of processes. One is the "gate first" process, and the other is the "gate last" process. The gate first process is similar to the convention CMOS process, where a metal gate is first manufactured and then a source and a drain are manufactured. The gate first process is simple, and is compatible with the conventional CMOS process. More specifically, some processes of the conventional CMOS process can be used also in the gate first process, which facilitates reducing of the cost. However, the gate first process still has some disadvantages which are hard to be overcome. First, there is a large possibility that the metal gate is penetrated by ions which are to be implanted into the source and the drain, so that a resultant device will have its electrical characteristics impacted. Second, a high-temperature thermal treatment for activating source/drain purities will significantly impact the work function of the metal gate. Specifically, most of materials for the metal gate have their work functions shift to the center of their respective forbidden bands after a high-temperature annealing treatment, so that the resultant device will have its performance degraded. The gate last process is also called the Damascus process. In the gate last process commonly used in the world, an arrangement of high-K gate dielectric/sacrificial gate is first manufactured. The sacrificial gate is removed by a planarization process after processes for source/drain implantation and activation are completed, to form a gate trench, into which a metal gate is deposited instead, resulting in a semiconductor device having the high-K gate dielectric/metal gate arrangement. The gate last process is advantageous in that the metal gate is formed after the annealing process for source/drain activation and thus will not have its characteristics impacted by the high-temperature process. As a result, the resultant device will exhibit high reliability and consistency, which facilitates manufacturing high-performance semiconductor devices having the high-K gate dielectric/metal gate arrangement and circuits having the same. However, the gate last process still have some disadvantages. For example, in the process of removing the sacrificial gate, the underlying high-K gate dielectric is prone to be damaged, so that the reliability of the high-K gate dielectric is reduced.

SUMMARY

The present disclosure provides, among others, a method for integrating a replacement gate in a semiconductor device. The method may comprise: forming a well region on a semiconductor substrate, and defining a N-type device region and/or a P-type device region; forming a sacrificial gate stack or sacrificial gate stacks respectively on the N-type device region and/or the P-type device region, the sacrificial gate stack or each of the sacrificial gate stacks comprising a sacrificial gate dielectric layer and a sacrificial gate electrode layer, wherein the sacrificial gate dielectric layer is disposed on the semiconductor substrate, and the sacrificial gate electrode layer is disposed on the sacrificial gate dielectric layer; forming a spacer or spacers surrounding the sacrificial gate stack or the respective sacrificial gate stacks; forming source/drain regions on both sides of the sacrificial gate stack or the respective sacrificial gate stacks and embedded into the semiconductor substrate; forming a $SiO_2$ layer on the semiconductor substrate; forming a Spin-On-Glass (SOG) layer on the $SiO_2$ layer; etching the SOG layer until the $SiO_2$ layer is exposed; etching the SOG layer and the $SiO_2$ layer at different rates in such a manner that the $SiO_2$ layer is planarized; and forming a N-type replacement gate stack on the N-type device region and/or a P-type replacement gate stack on the P-type device region, respectively.

According to the method for manufacturing the semiconductor device disclosed thereby, a sacrificial gate stack of $SiO_2$/poly-silicon can be adopted. As a result, on one hand it is possible to avoid impacts on electrical characteristics of the high-K gate dielectric/metal gate arrangement which would occur for the gate first process in the high-temperature annealing treatment, and on the other hand it is possible to avoid damages on the high-K dielectric which would occur for the high-K gate dielectric/sacrificial poly-silicon gate arrangement in removing the sacrificial poly-silicon gate. Further, according to various embodiments, the planarization can be achieved by the combination of $SiO_2$+SOG. After the planarization, the sacrificial gate stacks of $SiO_2$/poly-silicon for the N-type and P-type devices can be removed, and the replacement gate stacks of high-K gate dielectric/metal gate suitable to the N-type and P-type devices can be deposited instead.

BRIEF DESCRIPTION OF THE DRAWINGS

The above and other objects, features, and advantages of the present disclosure will become apparent from the following descriptions on embodiments with reference to the drawings, in which.

Figure 1:
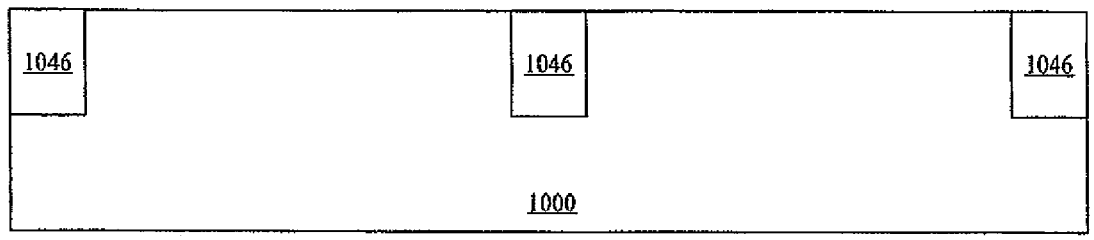
FIGS. 1-16 are sectional views showing device structures in respective steps of a flow for manufacturing a semiconductor device according to an embodiment, respectively.

LISTS OF REFERENCE NUMERALS 1000 semiconductor substrate;
1002 P well;
1004 N well;
1006 channel;
1008 sacrificial gate dielectric layer;
1009 sacrificial gate electrode layer;
1010 hard mask layer;
1012 first spacer of $Si_3N_4$;
1014 N-type source/drain extension;
1015 P-type source/drain extension;
1016 second spacer of $SiO_2$;
1018 N-type source/drain region;
1020 P-type source/drain region;
1022 metal silicide;
1024 $SiO_2$ dielectric layer;
1026 Spin-On-Glass (SOG);
1028 N-type high-K gate dielectric layer;
1030 N-type work-function metal gate electrode layer;
1032 N-type metal gate conductor layer;
1034 $SiO_2$ dielectric layer;
1036 photoresist;
1038 P-type high-K gate dielectric layer;
1040 P-type work-function metal gate electrode layer;
1042 P-type metal gate conductor layer;
1044 $SiO_2$ dielectric layer;
1046 isolation

DETAILED DESCRIPTION

Hereinafter, the present disclosure is described with reference to embodiments shown in the attached drawings. However, it is to be understood that those descriptions are just provided for illustrative purpose, rather than limiting the present disclosure. Further, in the following, descriptions of known structures and techniques are omitted so as not to unnecessarily obscure the concept of the present disclosure.

In the drawings, various layer structures according to embodiments of the present disclosure are schematically shown. However, they are not drawn to scale, and some features may be enlarged while some features may be omitted for purpose of clarity. Shapes, sizes and relative positions of respective regions and layers are only illustrative, and deviations therefrom may occur due to manufacture tolerances and technical limits. Those skilled in the art can otherwise design regions/layers of different shapes, sizes, or relative positions according to actual requirements.

FIGS. 1-16 are sectional views showing respective steps of a flow for manufacturing a semiconductor device according to an embodiment, respectively. In the following, the steps will be described in detail with reference to the drawings.

First, as shown in FIG. 1, a semiconductor substrate 1000 is provided. The substrate 1000 may comprise any suitable semiconductor substrate material, such as, but not limited to, silicon, germanium, silicon germanium, Semiconductor-On-Insulator (SOI), silicon carbide, gallium arsenide, or any III-V group compound semiconductor. Further, the semiconductor substrate 1000 may optionally comprise an epitaxial layer, which can be stressed to improve the performance.

Isolations 1046 can be formed on the semiconductor substrate 1000. For example, the isolations may be formed by Local Oxidation of Silicon (LOCOS). According to various embodiments, the isolations can be formed in other forms. It is to be noted that the isolations are not directly relevant to the subject matter of the present disclosure, and detailed descriptions thereof are omitted.

Figure 2:
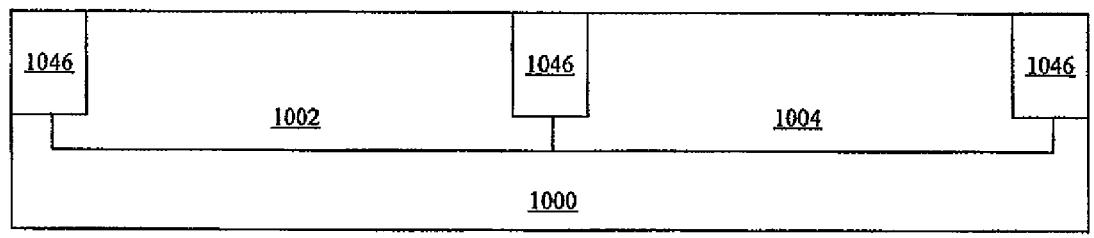

Next, as shown in FIG. 2, a P well 1002 and a N well 1004 are formed on the semiconductor substrate. Specifically, first a P well mask is formed by means of photolithography in such a manner that the P well mask exposes a well region, into which P-type impurities such as B or $BF_2$ are implanted through the mask. Next, the P well mask is removed, and a N well mask is formed by means of photolithography in such a manner that the N well mask exposes a well region, into which N-type impurities such as P or As are implanted through the mask. Finally, the P well and the N well are formed by driving in at a temperature of about 900-1000° C. Certainly, the order in which the P well and the N well are formed can be altered. It is to be noted that in some applications only one type of well(s), that is, either N well(s) or P well(s), can be formed.

Figure 3:
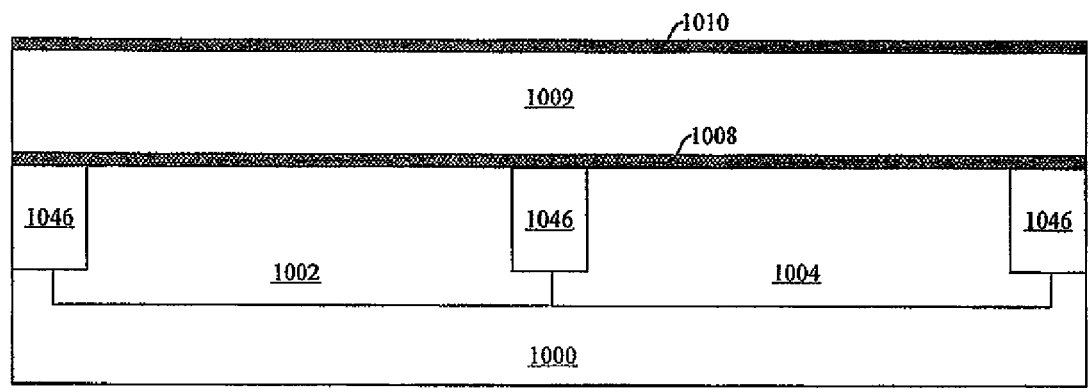

Subsequently, as shown in FIG. 3, a sacrificial gate dielectric layer 1008 is formed on the semiconductor substrate. According to an embodiment, the sacrificial gate dielectric layer 1008 may comprise a $SiO_2$ layer. Specifically, the semiconductor substrate can be subjected to conventional cleaning, have a natural oxidation layer thereon removed by means of $HF+IPA+H_2O$, and then have the sacrificial gate dielectric layer of $SiO_2$ formed thereon by oxidation with dry oxygen. The sacrificial gate dielectric layer of $SiO_2$ may have a thickness of about 1-3 nm.

Next, a sacrificial gate electrode layer 1009 is formed on the sacrificial gate dielectric layer 1008. According to an embodiment, the sacrificial gate electrode layer 1009 may comprise a poly-silicon layer. Specifically, the sacrificial poly-silicon layer may be formed by means of Low-Pressure Chemical Vapor Deposition (LPCVD), and may have a thickness of about 150-190 nm.

Then, a hard mask layer 1010 is formed on the sacrificial gate electrode layer 1009. According to an embodiment, the hard mask layer 1010 may comprise a $SiO_2$ hard mask layer. Specifically, the $SiO_2$ hard mask layer may be formed by means of Low-Temperature Oxidation (LTO), and may have a thickness of about 40-70 nm. More specifically, the thickness may be determined dependent on subsequent etching processes to form sacrificial gate stacks and spacers, in such a manner that the $SiO_2$ hard mask layer can be left with a thickness of, for example, about 10-20 nm after the etching processes to form the sacrificial gate stacks and the spacers, to prevent the sacrificial poly-silicon layer from being subjected to silicidation during a process of forming source/drain silicide.

Figure 4:
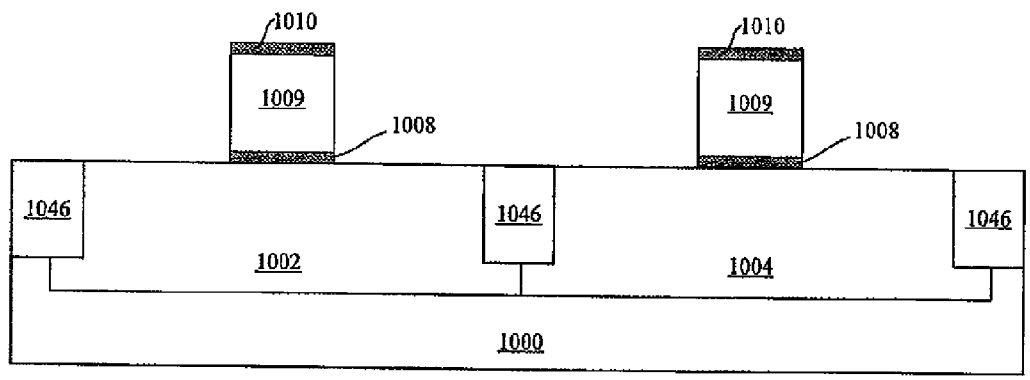

Next, as shown in FIG. 4, the sacrificial gate arrangement is patterned. Specifically, photoresist is spin coated on the sacrificial gate arrangement, and is patterned. The $SiO_2$ hard mask layer 1010 is etched using the photoresist as a mask, and then the photoresist is removed. After that, the sacrificial poly-silicon layer 1009 and the sacrificial gate dielectric layer of $SiO_2$ 1008 are etched using the $SiO_2$ hard mask layer 1010 as a mask, resulting in the sacrificial gate stacks.

Figure 5:
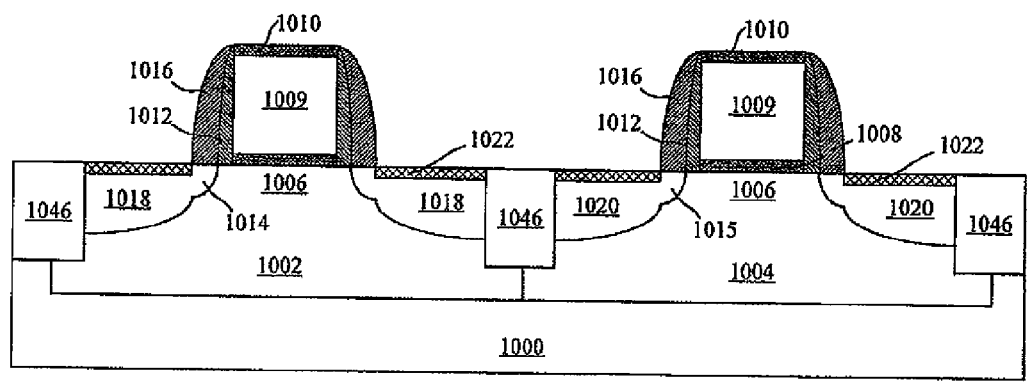

Subsequently, as shown in FIG. 5, first spacers 1012, such as $Si_3N_4$, are formed surrounding the respective sacrificial gate stacks. Specifically, a $Si_3N_4$ layer may be formed by means of Plasma-Enhanced Chemical Vapor Deposition (PECVD) to have a thickness of about 50-90 nm. Then, the $Si_3N_4$ layer may be etched back by means of dry etching such as Reactive-Ion Etching (RIE) to form the $Si_3N_4$ spacers. After that, source/drain extensions may be formed by ion implantation. For a NMOSFET, N-type source/drain extensions 1014 can be formed by implanting As or Sb, for example; and for a PMOSFET, P-type source/drain extensions 1015 can be formed by implanting $BF_2$ or In, for example.

Next, second spacers 1016, such as $SiO_2$, can be formed outside the first spacers of $Si_3N_4$ 1012 to surround the respective first spacers 1012. Specifically, a $SiO_2$ layer may be formed by means of LTO to have a thickness of about 80-120 nm. Then, the $SiO_2$ layer may be etched back by means of dry etching to form the $SiO_2$ spacers. After that, source/drain regions may be formed by ion implantation. For example, for a NMOSFET, N-type source/drain regions 1018 can be formed by implanting As or Sb, for example; and for a PMOSFET, P-type source/drain regions 1020 can be formed by implanting $BF_2$ or In, for example.

According to a further embodiment, third spacers may be further formed surrounding the respective second spacers 1016. The third spacers may comprise $Si_3N_4$. Here, the third spacers are not shown.

Here, silicides 1022 may be formed on the source/drain regions. According to an embodiment, the silicides may comprise Ni silicides.

Figure 6:
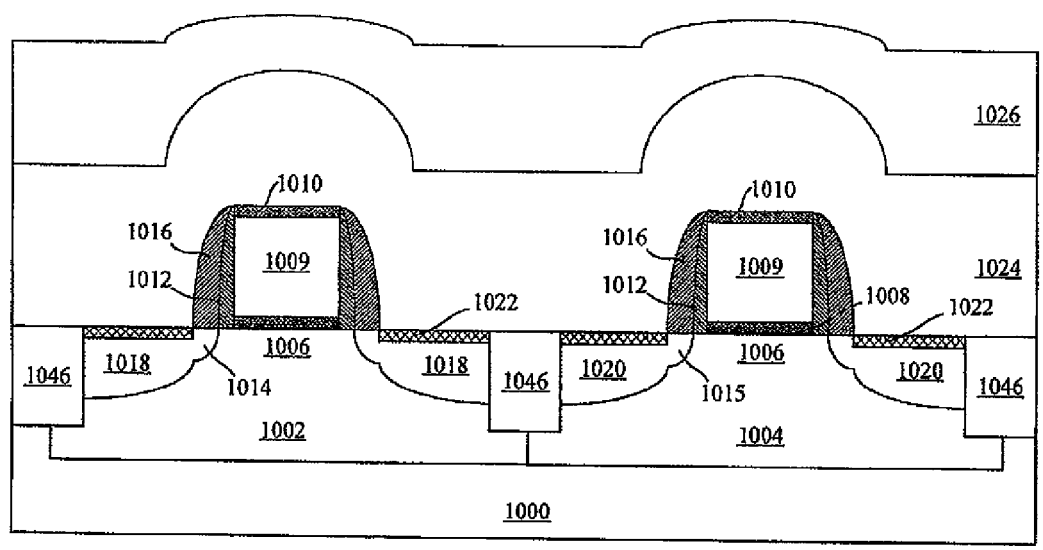

After that, as shown in FIG. 6, a $SiO_2$ dielectric layer 1024 is formed on the device. According to an embodiment, the $SiO_2$ dielectric layer 1024 may be formed by LTO, and may have a thickness of about 600-800 nm.

Next, Spin-On-Glass (SOG) 1026 is spin coated. The SOG in a liquid state can fill recesses present on the device surface so as to planarize the device surface. Then, the SOG is subjected to annealing to be solidified, so that the SOG have its solvent evaporate and thus becomes a $SiO_2$ layer.

Figure 7:
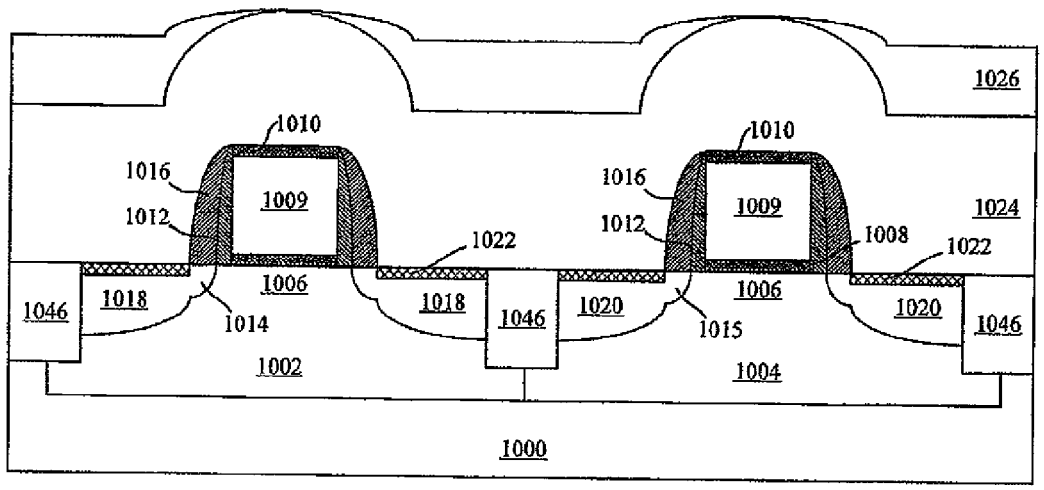

Subsequently, as shown in FIG. 7, the SOG is etched by dry etching until an interface between the SOG and the $SiO_2$ dielectric layer is reached. In the etching, etching gas may comprise $CF_4$ and $CHF_3$.

Figure 8:
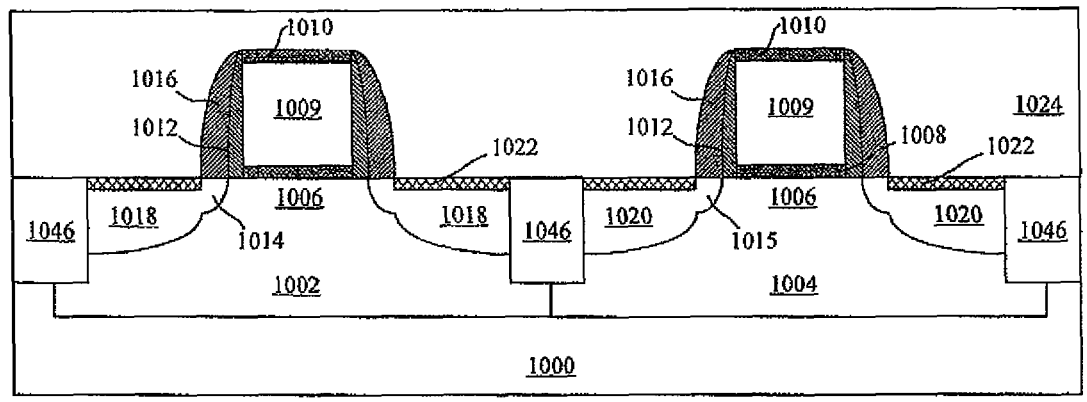

Then, as shown in FIG. 8, the SOG 1026 and the $SiO_2$ dielectric layer 1024 are etched by dry etching in such a manner that a ratio of the etching rate of $SiO_2$ formed from the SOG to that of $SiO_2$ formed by LTO is in a range from about 1:1.2 to about 1:2, so as to achieve planarization. In the etching, etching gas may comprise $CF_4$ and $CHF_3$. Components of the etching gas may have their proportions adjusted to achieve the etching of the SOG and $SiO_2$ at different rates. After the planarization, the $SiO_2$ dielectric layer can be further etched by dry etching until the $SiO_2$ dielectric layer has a thickness of about 50-100 nm remained on the top of the sacrificial gate stacks.

Figure 9:
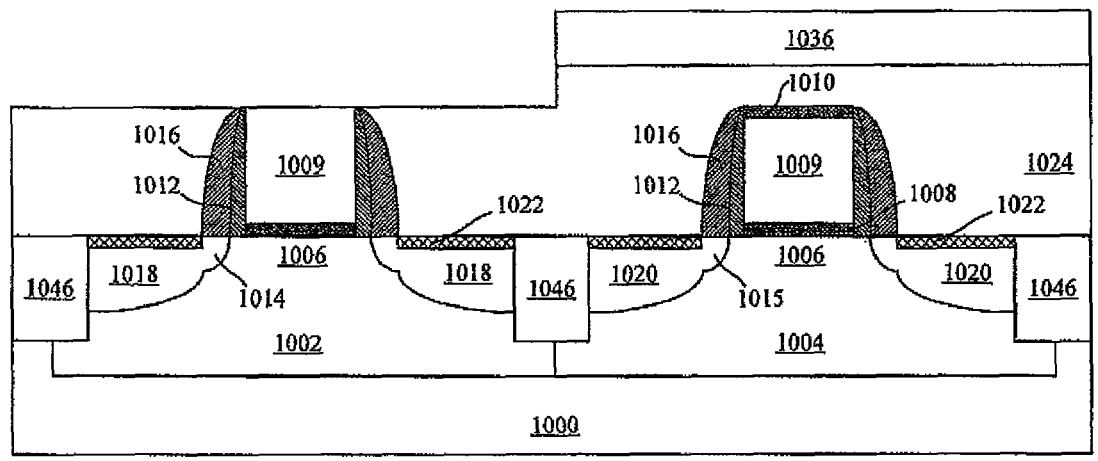

Next, as shown in FIG. 9, the PMOSFET region is masked by photoresist 1036, while the NMOSFET region is exposed. After that, the $SiO_2$ dielectric layer 1024 is etched by dry etching until the top of the sacrificial poly-silicon gate electrode is exposed.

Figure 10:
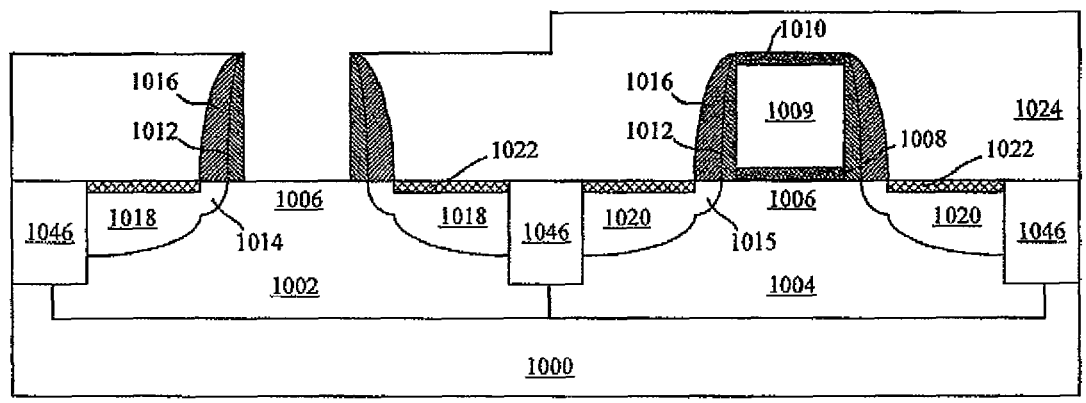

Then, as shown in FIG. 10, the sacrificial poly-silicon gate electrode can be etched by a tetramethy ammonium hydroxide (TMAH) solution. For example, in the TMAH solution a volume ratio of TMAH to $H_2O$ is in a range from about 1:15 to about 1:5, and the etching can be performed at a temperature of about 50-80° C. Further, the sacrificial gate dielectric of $SiO_2$ can be etched by a $HF+IPA+H_2O$ solution. In the $HF+IPA+H_2O$ solution, HF may have a volume percentage of about 10-15%, and IPA may have a volume percentage of about 0.01-1%. As a result, an opening is formed inside the spacer.

Figure 11:
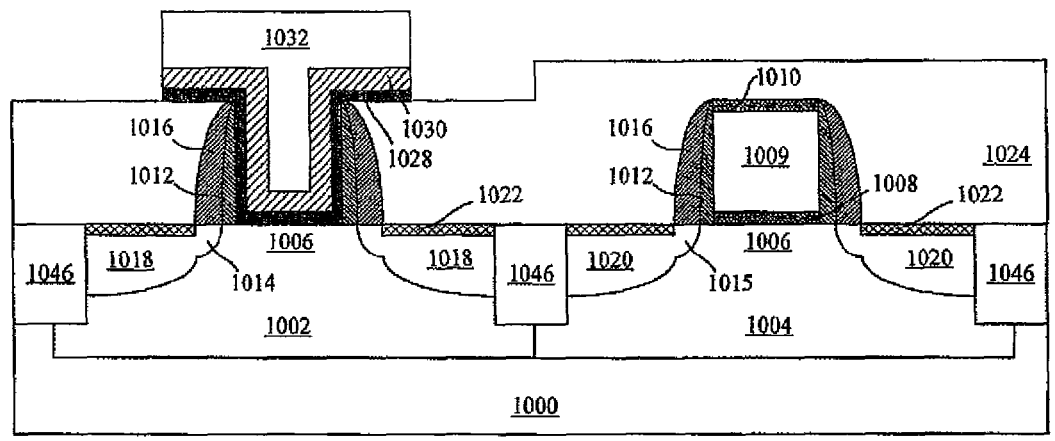

After that, as shown in FIG. 11, a N-type high-K dielectric/metal gate arrangement is formed in the opening inside the spacer. Specifically, the semiconductor substrate can be subjected to cleaning, have a natural oxidation layer thereon removed by means of $HF+IPA+H_2O$, and then have a $SiO_2$ interface layer (not shown) formed thereon by means of fast thermal annealing with a thickness of about 5-10 Å. A high-K gate dielectric layer 1028, such as HfSiON, can be deposited on the $SiO_2$ interface layer by means of, for example, magnetron sputtering. The high-K gate dielectric layer of HfSiON can be subjected to fast thermal annealing at a temperature of about 500-530° C., for example. Then, a work-function metal gate electrode layer 1030, such as TaN, can be formed on the high-K gate dielectric layer of HfSiON, and a metal gate conductor layer 1032, such as W, can be formed on the work-function metal gate electrode layer of TaN. Photoresist may be spin coated on the metal gate conductor layer of W, and is patterned in such a manner that the patterned photoresist can cover some extent, for example, about 0.5-4 μm, of the spacer outside the opening. The W layer, the TaN layer and the HfSiON layer are then etched by means of plasma dry etching, to form the high-K dielectric/metal gate arrangement in a T form.

Figure 12:
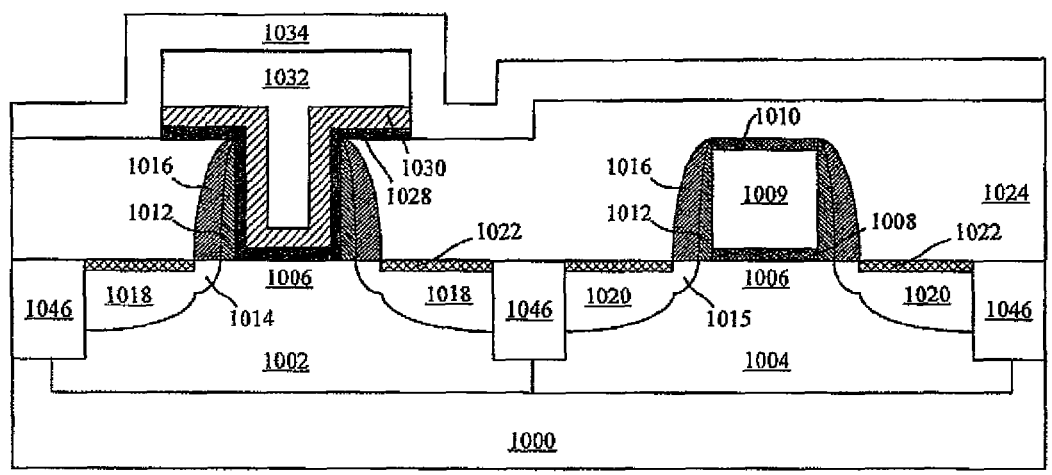

Subsequently, as shown in FIG. 12, a further $SiO_2$ dielectric layer 1034 is formed on the device. According to an embodiment, the $SiO_2$ dielectric layer may be formed by LTO, and may have a thickness of about 400-600 nm.

Figure 13:
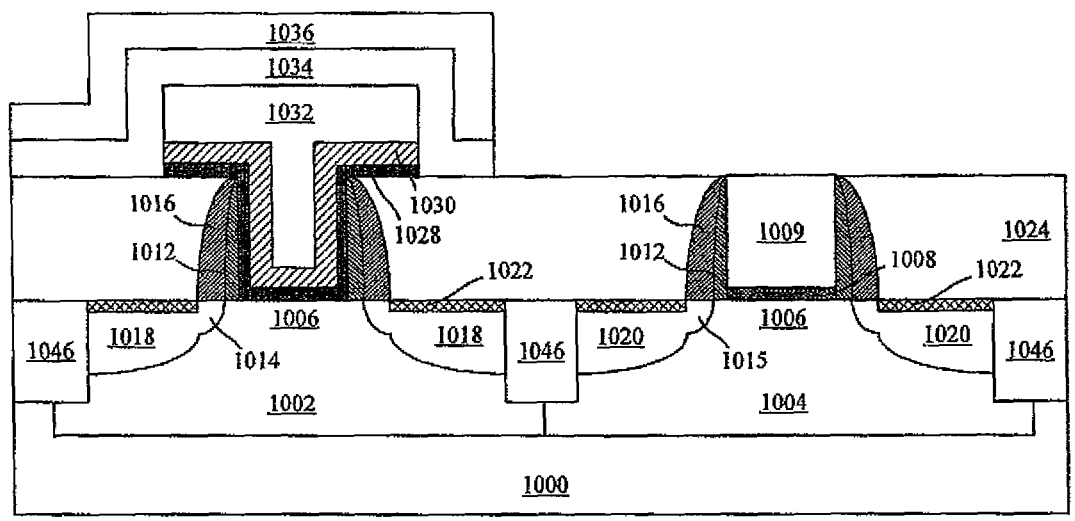

Next, as shown in FIG. 13, the NMOSFET region is masked by photoresist 1036, while the PMOSFET region is exposed. After that, the $SiO_2$ dielectric layers 1034 and 1024 are etched by dry etching until the top of the sacrificial poly-silicon gate electrode is exposed.

Figure 14:
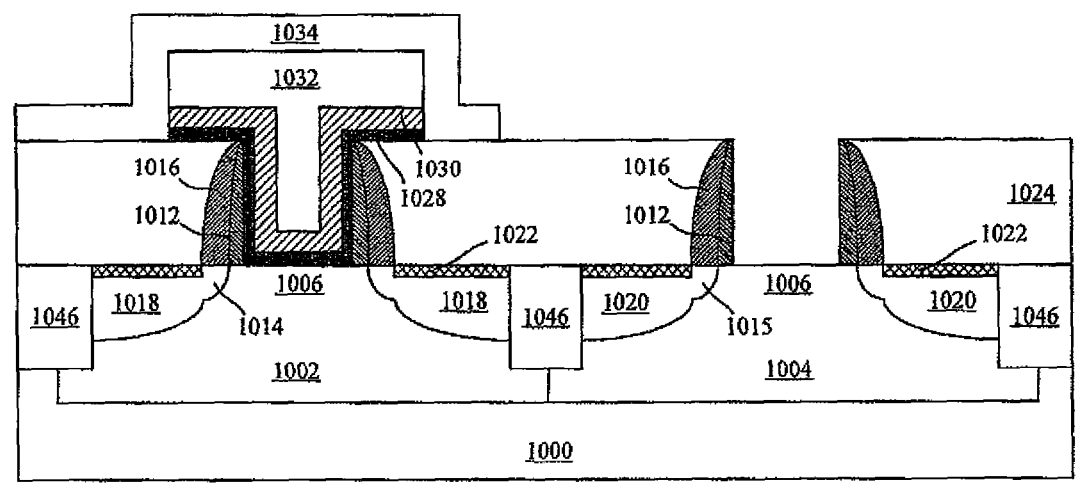

Likewise, as shown in FIG. 14, the sacrificial poly-silicon gate electrode can be etched by a tetramethy ammonium hydroxide (TMAH) solution, and the sacrificial gate dielectric of $SiO_2$ can be etched by a $HF+IPA+H_2O$ solution. As a result, an opening is formed inside the spacer.

Figure 15:
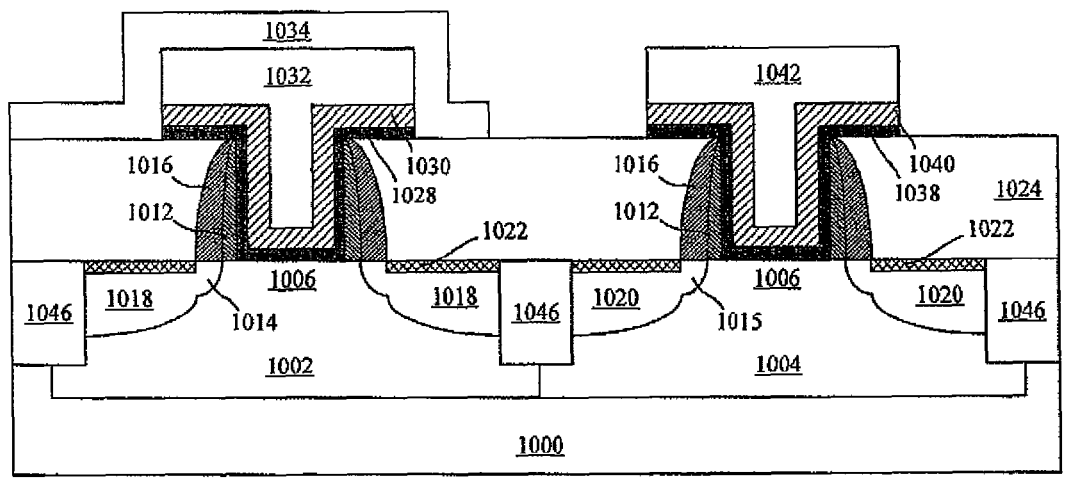

After that, as shown in FIG. 15, a P-type high-K dielectric/metal gate arrangement is formed in the opening inside the spacer. Specifically, the semiconductor substrate can be subjected to cleaning, have a natural oxidation layer thereon removed by means of $HF+IPA+H_2O$, and then have a $SiO_2$ interface layer (not shown) formed thereon by means of fast thermal annealing with a thickness of about 5-10 Å. A high-K gate dielectric layer 1038, such as HfSiAlON, can be deposited on the $SiO_2$ interface layer by means of, for example, magnetron sputtering. The high-K gate dielectric layer of HfSiAlON can be subjected to fast thermal annealing at a temperature of about 500-530° C., for example. Then, a work-function metal gate electrode layer 1040, such as AlN, can be formed on the high-K gate dielectric layer of HfSiAlON, and a metal gate conductor layer 1042, such as Mo, can be formed on the work-function metal gate electrode layer of AlN. Photoresist may be spin coated on the metal gate conductor layer of Mo, and is patterned in such a manner that the patterned photoresist can cover some extent, for example, about 0.5-4 μm, of the spacer outside the opening. The Mo layer, the AlN layer and the HfSiAlON layer are then etched by means of plasma dry etching, to form the high-K dielectric/metal gate arrangement in a T form.

Figure 16:
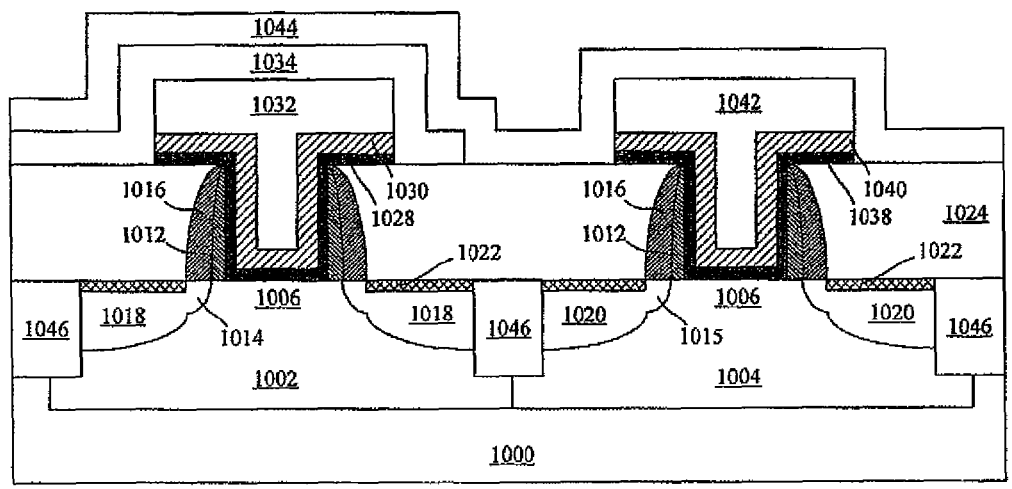

Subsequently, as shown in FIG. 16, a further SiO$_2$ dielectric layer 1044 is formed on the device. According to an embodiment, the SiO$_2$ dielectric layer may be formed by LTO, and may have a thickness of about 400-600 nm.

In the above embodiment, the N-type high-K gate dielectric/metal gate arrangement is formed first, and then is the P-type high-K gate dielectric/metal gate arrangement. It is to be noted that the order in which the N-type and P-type gate dielectric/metal gate arrangement are formed can be altered. Further, in the above embodiment, an example where two complementary devices (one is the N-type device and the other is the P-type device) are formed is given. However, those skilled in the art would understand that the disclosed method can also apply to a single device or to three or more devices.

After the semiconductor devices are formed as described above, further processes can be conducted. For example, through holes may be etched on the gate and source/drain regions, and may have metal interconnection lines such as Ti, TiN, Al and TiN filled therein, which can be patterned to form wires (not shown) to the gates and sources/drains.

In the above description, details of patterning and etching of the respective layers are not provided. It is to be understood by those skilled in the art that various means in the prior art may be utilized to form the layers and regions in desired shapes. Further, to achieve the same feature, those skilled can devise different methods than those described above.

According to the method for manufacturing semiconductor device(s) disclosed hereby, a sacrificial gate arrangement of SiO$_2$/poly-silicon can be adopted. As a result, on one hand it is possible to avoid impacts on electrical characteristics of the high-K gate dielectric/metal gate arrangement which would occur for the gate first process in the high-temperature annealing treatment, and on the other hand it is possible to avoid damages on the high-K dielectric which would occur for the high-K gate dielectric/sacrificial poly-silicon gate arrangement in removing the sacrificial poly-silicon gate.

Further, the present applicant can also achieve, at least or in part, the following advantages.

According to various embodiments, a two-layer spacer arrangement such as Si$_3$N$_4$/SiO$_2$ or a three-layer spacer arrangement such as Si$_3$N$_4$/SiO$_2$/Si$_3$N$_4$ may be used. Specifically, the first spacer of Si$_3$N$_4$ close to the metal gate can effectively prevent the high-K gate dielectric and the metal gate from being oxidized, and thus to prevent the Equivalent Oxide Thickness of the high-K gate dielectric from being increased and prevent the metal gate from being degraded.

According to various embodiments, the planarization is achieved by the combination of SiO$_2$+SOG. Specifically, first the SiO$_2$ dielectric layer is formed by LTO to reduce the height difference between the gate stack and the source/drain, resulting in preliminary planarization. Then, the SOG is adopted to achieve further planarization. The SOG in the liquid state can fill and thus reduce the height difference between the gate stack and the source/drain, to achieve desirable planarazation. The SOG is converted into a SiO$_2$ layer through annealing, which is compatible with the SiO$_2$ dielectric layer formed by LTO. This facilitates the subsequent dry etching process to achieve the desirable planarization.

According to various embodiments, the sacrificial poly-silicon gate can be etched by the TMAH solution. This helps improve the selectivity of the sacrificial poly-silicon gate with respect to the SiO$_2$ gate dielectric.

According to various embodiments, the sacrificial gate dielectric of SiO$_2$ can be etched by the HF+IPA+H$_2$O solution. Specifically, HF in a relatively low concentration can reduce the etching rate of the sacrificial gate dielectric of SiO$_2$. Further, the use of IPA can achieve a good interface characteristic by suppressing growing of a natural oxidation layer.

The present disclosure is described above with reference to the embodiments thereof. However, those embodiments are provided just for illustrative purpose, rather than limiting the present disclosure. The scope of the disclosure is defined by the attached claims as well as equivalents thereof. Those skilled in the art can make various alternations and modifications without departing from the scope of the disclosure, which all fall into the scope of the disclosure.

We claim:

1. A method for integrating a replacement gate in a semiconductor device, comprising:
   forming a well region on a semiconductor substrate, and defining a N-type device region and/or a P-type device region;
   forming a sacrificial gate stack or sacrificial gate stacks respectively on the N-type device region and/or the P-type device region, the sacrificial gate stack or each of the sacrificial gate stacks comprising a sacrificial gate dielectric layer and a sacrificial gate electrode layer, wherein the sacrificial gate dielectric layer is disposed on the semiconductor substrate, and the sacrificial gate electrode layer is disposed on the sacrificial gate dielectric layer;
   forming a spacer or spacers surrounding the sacrificial gate stack or the respective sacrificial gate stacks;
   forming source/drain regions on both sides of the sacrificial gate stack or the respective sacrificial gate stacks and embedded into the semiconductor substrate;
   forming a SiO$_2$ layer on the semiconductor substrate;
   forming a Spin-On-Glass (SOG) layer on the SiO$_2$ layer;
   etching the SOG layer until the SiO$_2$ layer is exposed;
   etching the SOG layer and the SiO$_2$ layer at different rates in such a manner that the SiO$_2$ layer is planarized; and
   forming a N-type replacement gate stack on the N-type device region and/or a P-type replacement gate stack on the P-type device region, respectively.

2. The method according to claim 1, wherein forming a sacrificial gate stack or sacrificial gate stacks respectively on the N-type device region and/or the P-type device region comprises:
   forming a sacrificial gate dielectric layer, a sacrificial gate electrode layer and a hard mask layer in sequence on the N-type device region and/or the P-type device region; and
   etching the sacrificial gate dielectric layer, the sacrificial gate electrode layer and the hard mask layer in such a manner that the etched sacrificial gate dielectric layer and the etched sacrificial gate electrode layer constitute the sacrificial gate stack or the sacrificial gate stacks, and the etched hard mask layer constitutes hard masks.

3. The method according to claim 2, wherein the sacrificial gate dielectric layer comprises a SiO$_2$ gate dielectric layer, and the sacrificial gate electrode layer comprises a ploy-silicon gate electrode layer.

4. The method according to claim 1, forming a spacer or spacers surrounding the sacrificial gate stack or the respective sacrificial gate stacks comprises:
   forming a Si$_3$N$_4$ spacer and Si$_3$N$_4$ spacers surrounding the sacrificial gate stack or the respective sacrificial gate stacks.

5. The method according to claim 1, forming a spacer or spacers surrounding the sacrificial gate stack or the respective sacrificial gate stacks comprises:

forming a first spacer or first spacers surrounding the sacrificial gate stack or the respective sacrificial gate stacks, and forming a second spacer or second spacers surrounding the first spacer or the respective first spacers, wherein the first spacer or the first spacers comprise $Si_3N_4$, and the second spacer or the second spacers comprise $SiO_2$.

6. The method according to claim 1, forming a $SiO_2$ layer on the semiconductor substrate comprises:
forming the $SiO_2$ layer on the semiconductor substrate by means of low-temperature oxidation.

7. The method according to claim 1, wherein forming a SOG layer on the $SiO_2$ layer comprises spin coating SOG in a liquid state evenly on the $SiO_2$ layer, and solidifying the SOG by means of annealing to form a $SiO_2$ dielectric layer.

8. The method according to claim 1, wherein etching the SOG layer until the $SiO_2$ layer is exposed comprises dry etching the SOG layer until the $SiO_2$ layer is exposed.

9. The method according to claim 1, wherein etching the SOG layer and the $SiO_2$ layer at different rates in such a manner that the $SiO_2$ layer is planarized comprises dry etching the SOG layer and the $SiO_2$ layer at the interface between the SOG layer and the $SiO_2$ layer, wherein a ratio of the etching rate of the SOG layer to that of the $SiO_2$ layer is in a range from about 1:1.2 to about 1:2 so that the $SiO_2$ layer is planarized.

10. The method according to claim 9, after the $SiO^2$ layer is planarized, the method further comprises further dry etching the $SiO^2$ layer until the $SiO^2$ layer has a thickness of about 50-100 nm remained on top of the sacrificial gate stack or the sacrificial gate stacks.

11. The method according to claim 1, after the $SiO_2$ layer is planarized, the method further comprises further dry etching the $SiO_2$ layer until the $SiO_2$ layer has a thickness of about 50-100 nm remained on the top of the sacrificial gate stack or the sacrificial gate stacks.

12. The method according to claim 1, wherein both the N-type device region and the P-type device region are formed on the semiconductor substrate, and wherein forming a N-type replacement gate stack on the N-type device region and a P-type replacement gate stack on the P-type device region respectively comprises:
selectively removing a portion of the $SiO_2$ layer on the N-type device region until the sacrificial gate stack on the N-type device region is exposed;
removing the sacrificial gate stack to form an opening in the spacer;
forming the N-type replacement gate stack in the opening;
forming a further $SiO_2$ layer on the semiconductor substrate;
selectively removing a portion of the $SiO_2$ layer on the P-type device region until the sacrificial gate stack on the P-type device region is exposed;
removing the sacrificial gate stack to form an opening in the spacer; and
forming the P-type replacement gate stack in the opening, or
wherein forming a N-type replacement gate stack on the N-type device region and a P-type replacement gate stack on the P-type device region respectively comprises:
selectively removing a portion of the $SiO^2$ layer on the P-type device region until the sacrificial gate stack on the P-type device region is exposed;
removing the sacrificial gate stack to form an opening in the spacer;
forming the P-type replacement gate stack in the opening;
forming a further $SiO^2$ layer on the semiconductor substrate;
selectively removing a portion of the $SiO^2$ layer on the N-type device region until the sacrificial gate stack on the N-type device region is exposed;
removing the sacrificial gate stack to form an opening in the spacer; and
forming the N-type replacement gate stack in the opening.

13. The method according to claim 12, wherein selectively removing a portion of the $SiO_2$ layer on the N-type device region until the sacrificial gate stack on the N-type device region is exposed comprises:
masking the P-type device region by photoresist; and
dry etching the $SiO_2$ layer until the sacrificial gate stack on the N-type device region is exposed.

14. The method according to claim 12, wherein, selectively removing a portion of the $SiO_2$ layer on the P-type device region until the sacrificial gate stack on the P-type device region is exposed comprises:
masking the N-type device region by photoresist; and
dry etching the $SiO_2$ layer until the sacrificial gate stack on the P-type device region is exposed.

15. The method according to claim 12, wherein removing the sacrificial gate stack to form an opening in the spacer comprises:
wet etching the sacrificial gate electrode layer of polysilicon by a Tetramethy ammonium hydroxide (TMAH) solution; and
wet etching the sacrificial gate dielectric layer of $SiO_2$ by a solution of $HF+IPA+H_2O$.

16. The method according to claim 15, wherein in the TMAH solution, a volume ratio of TMAH to $H_2O$ is in a range from about 1:15 to about 1:5, and wherein the etching is performed at a temperature of about 50-80° C.

17. The method according to claim 15, wherein in the solution of $HF+IPA+H_2O$, HF has a volume percentage of about 10-15%, and IPA has a volume percentage of about 0.01-1%.

18. The method according to claim 12, wherein forming the N-type replacement gate stack in the opening inside the spacer on the N-type device region comprises:
forming a N-type high-K gate dielectric layer in the opening inside the spacer;
forming a N-type metal gate electrode layer on the N-type high-K gate dielectric layer; and
etching the N-type metal gate electrode layer and the N-type high-K gate dielectric layer in such a manner that the etched N-type metal gate electrode layer and the etched N-type high-K gate dielectric layer constitute the N-type replacement gate stack.

19. The method according to claim 18, wherein the N-type high-K gate dielectric layer comprises any one of HfSiON, HfLaON and HfTaON, or any combination thereof.

20. The method according to claim 18, wherein the N-type metal gate electrode layer comprises any one of TaN, TiN and HfN, or any combination thereof.

21. The method according to claim 12, wherein forming the P-type replacement gate stack in the opening inside the spacer on the P-type device region comprises:
forming a P-type high-K gate dielectric layer in the opening inside the spacer;
forming a P-type metal gate electrode layer on the P-type high-K gate dielectric layer; and
etching the P-type metal gate electrode layer and the P-type high-K gate dielectric layer in such a manner that the etched P-type metal gate electrode layer and the etched P-type high-K gate dielectric layer constitute the P-type replacement gate stack.

22. The method according to claim 21, wherein the P-type high-K gate dielectric layer comprises any one of HfAlON, HfSiAlON and HfTiON, or any combination thereof.

23. The method according to claim 21, wherein the P-type metal gate electrode layer comprises any one of AlN, TiAlN, TaAlN and MoAlN, or any combination thereof.

* * * * *